United States Patent
Sato

(10) Patent No.: US 10,355,653 B2
(45) Date of Patent: Jul. 16, 2019

(54) POWER AMPLIFIER CIRCUIT

(71) Applicant: Murata Manufacturing Co., Ltd., Kyoto (JP)

(72) Inventor: Hideyuki Sato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/967,914

(22) Filed: May 1, 2018

(65) Prior Publication Data

US 2018/0342992 A1 Nov. 29, 2018

(30) Foreign Application Priority Data

May 23, 2017 (JP) .................................. 2017-101540

(51) Int. Cl.
| | |
|---|---|
| *H03F 3/04* | (2006.01) |
| *H03F 3/213* | (2006.01) |
| *H03F 1/30* | (2006.01) |
| *H03F 3/195* | (2006.01) |
| *H03F 1/08* | (2006.01) |
| *H03G 3/30* | (2006.01) |

(52) U.S. Cl.
CPC ............. *H03F 3/213* (2013.01); *H03F 1/083* (2013.01); *H03F 1/302* (2013.01); *H03F 3/195* (2013.01); *H03F 2200/18* (2013.01); *H03F 2200/21* (2013.01); *H03F 2200/222* (2013.01); *H03F 2200/267* (2013.01); *H03F 2200/297* (2013.01); *H03F 2200/451* (2013.01); *H03G 3/3042* (2013.01)

(58) Field of Classification Search
CPC .......... H03F 3/213; H03F 3/195; H03F 1/302; H03F 1/083; H03F 2200/297; H03F 2200/222; H03F 2200/21; H03F 2200/451; H03F 2200/267; H03F 2200/18; H03F 1/301; H03F 1/0261; H03G 3/3042; H03G 3/3047
USPC .................................................. 330/285, 296
See application file for complete search history.

(56) References Cited

U.S. PATENT DOCUMENTS

| | | | |
|---|---|---|---|
| 7,834,700 B2 | 11/2010 | Inamori et al. | |
| 9,337,787 B2 * | 5/2016 | Schooley | H03F 3/21 |
| 9,742,358 B2 * | 8/2017 | Shimamoto | H03F 1/0261 |
| 9,825,594 B2 * | 11/2017 | Watanabe | H03F 1/0261 |
| 2013/0328626 A1 * | 12/2013 | Shibuya | H03F 1/0222 |
| | | | 330/131 |

(Continued)

FOREIGN PATENT DOCUMENTS

| | | |
|---|---|---|
| JP | 2005-6212 A | 1/2005 |
| JP | 2010-124433 A | 6/2010 |

*Primary Examiner* — Khanh V Nguyen
(74) *Attorney, Agent, or Firm* — Pearne & Gordon LLP

(57) ABSTRACT

A power amplifier circuit includes a first amplifier transistor, an input signal being supplied to a base of the first amplifier transistor, a first amplification signal obtained by amplifying the input signal being output from a collector of the first amplifier transistor; a first bias circuit that supplies a first current or a first voltage to the base of the first amplifier transistor; a second bias circuit that supplies a second current or a second voltage to the base of the first amplifier transistor; and a first resistor element that is connected in series between the base of the first amplifier transistor and the first bias circuit. The second bias circuit includes a diode, an impedance circuit, and a first capacitor element.

18 Claims, 5 Drawing Sheets

(56) References Cited

U.S. PATENT DOCUMENTS

2018/0062579 A1* 3/2018 Tanaka ................. H03F 1/0205

* cited by examiner

POWER AMPLIFIER CIRCUIT

This application claims priority from Japanese Patent Application No. 2017-101540 filed on May 23, 2017. The content of this application is incorporated herein by reference in its entirety.

BACKGROUND

The present disclosure relates to a power amplifier circuit. In general, bipolar transistors are used as amplifiers in power amplifier circuits mounted on mobile communication apparatuses such as cellular phones. Bipolar transistors have thermal positive feedback characteristics in which as the temperature of a transistor element increases, the amount of a collector current increases, which causes a further increase in the temperature and an accompanying increase in the amount of the collector current. Thus, for example, a configuration is known in which a resistor element (hereinafter, may also be referred to as a "ballast resistor") is inserted between the base of a bipolar transistor and a base bias voltage supply terminal in order to suppress an increase in the amount of a collector current caused by a temperature increase.

With such a configuration including a ballast resistor, when the amount of a current flowing from the base bias voltage supply terminal to the base of the amplifier increases as the power level of an input signal increases, a voltage drop in the ballast resistor increases. Therefore, the base voltage of the amplifier drops. Accordingly, a phenomenon may occur in which the amplitude of the base current is not accompanied by the amplitude of a collector current and a power gain thus decreases (hereinafter, may also be referred to as a "gain compression").

A power amplifier including an impedance circuit that blocks DC components but transmits AC components to reduce the gain compression is disclosed, for example, Japanese Unexamined Patent Application Publication No. 2005-6212. With this configuration, even if the amount of a current flowing from the base bias voltage supply terminal to the base of the bipolar transistor increases, part of the current flows to the impedance circuit, and therefore, a voltage drop in the ballast resistor may be reduced. Furthermore, by changing the impedance of the impedance circuit using an external control signal, the ratio of the amount of a current flowing in the impedance circuit and the amount of a current flowing in the ballast resistor may be adjusted.

With the configuration disclosed in Japanese Unexamined Patent Application Publication No. 2005-6212, when signal amplitude is transmitted to the emitter of the bipolar transistor included in the impedance circuit at the time when a large signal is input, the signal amplitude may be propagated to the base of the bipolar transistor via a parasitic capacitance between the base and emitter of the bipolar transistor. In this configuration, a control voltage is supplied to the base of the bipolar transistor via the resistor element, and the base voltage may thus vibrate in accordance with vibrations of the emitter voltage. Therefore, a sufficient current does not flow between the collector and emitter of the bipolar transistor, and a function as a bypass circuit cannot be fully achieved.

BRIEF SUMMARY

Accordingly, the present disclosure provides a power amplifier circuit that is capable of reducing a gain compression at the time when a large signal is input.

According to embodiments of the present disclosure, a power amplifier circuit includes a first amplifier transistor, an input signal being supplied to a base of the first amplifier transistor, a first amplification signal obtained by amplifying the input signal being output from a collector of the first amplifier transistor; a first bias circuit that supplies a first current or a first voltage to the base of the first amplifier transistor; a second bias circuit that supplies a second current or a second voltage to the base of the first amplifier transistor; and a first resistor element that is connected in series between the base of the first amplifier transistor and the first bias circuit. The second bias circuit includes a diode, a power supply voltage being supplied to an anode of the diode, an impedance circuit that is provided between a cathode of the diode and a ground, and a first capacitor element, one end of the first capacitor element being connected to a connection point of the cathode of the diode and the impedance circuit, the second current or the second voltage being supplied from the other end of the first capacitor element to the base of the first amplifier transistor.

According to the present disclosure, a power amplifier circuit that is capable of reducing a gain compression at the time when a large signal is input may be provided.

Other features, elements, characteristics and advantages of the present disclosure will become more apparent from the following detailed description of embodiments of the present disclosure with reference to the attached drawings.

DETAILED DESCRIPTION

Hereinafter, an embodiment of the present disclosure will be described with reference to the drawings. The same elements will be referred to with the same signs, and redundant explanation will be omitted.

Figure 1:
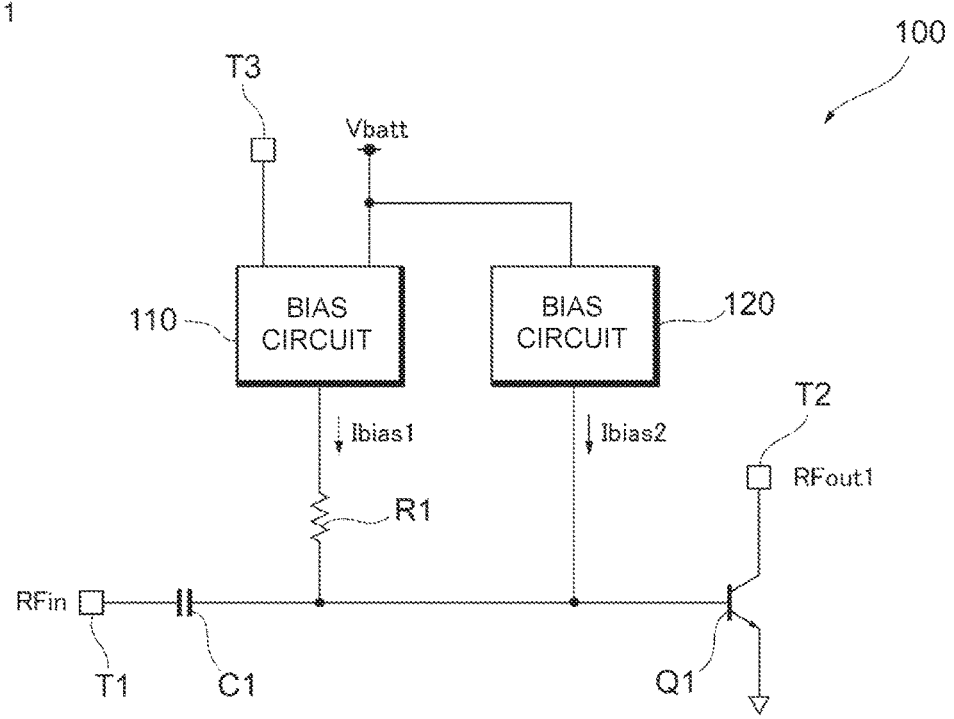
FIG. 1 is a block diagram illustrating a schematic configuration of a power amplifier circuit according to a first embodiment of the present disclosure.

FIG. 1 is a block diagram illustrating a schematic configuration of a power amplifier circuit according to a first embodiment of the present disclosure. A power amplifier circuit 100 illustrated in FIG. 1 is mounted on a mobile communication apparatus such as, for example, a cellular phone, and is used to amplify power of a radio frequency (RF) signal to be transmitted to a base station. The power amplifier circuit 100 amplifies power of a signal of a communication standard such as, for example, a second-generation mobile communication system (2G), a third-generation mobile communication system (3G), a fourth-generation mobile communication system (4G), a fifth-generation mobile communication system (5G), long term evolution (LTE)-frequency division duplex (FDD), LTE-time division duplex (TDD), LTE-Advanced, and LTE- Advanced Pro. A communication standard of signals amplified by the power amplifier circuit 100 is not limited to the communication standard mentioned above.

As illustrated in FIG. 1, the power amplifier circuit 100 includes, for example, an input terminal T1, an output terminal T2, a transistor Q1, bias circuits 110 and 120, a capacitor element C1, and a resistor element R1. The power amplifier circuit 100 is a circuit that amplifies an input signal RFin supplied to the input terminal T1 and outputs an amplification signal RFout1 (first amplification signal) from the output terminal T2. Individual components will be explained in detail below.

A power supply voltage (not illustrated in FIG. 1) is supplied to the collector of a transistor Q1 (first amplifier transistor), the capacitor element C1 is connected in series with the base of the transistor Q1, and the emitter of the transistor Q1 is connected to the ground. The input signal RFin is supplied to the base of the transistor Q1 via the capacitor element C1, a bias current Ibias1 is supplied to the base of the transistor Q1 from the bias circuit 110 via the resistor element R1, and a bias current Ibias2 is supplied to the base of the transistor Q1 from the bias circuit 120. Accordingly, the amplification signal RFout1 obtained by amplifying the input signal RFin is output from the collector of the transistor Q1.

The transistor Q1 may have a configuration in which a plurality of unit transistors (fingers) is connected in parallel (that is, a multi-finger configuration).

Furthermore, the transistor Q1 is not particularly limited. The transistor Q1 will be explained herein as, for example, a bipolar transistor such as a heterojunction bipolar transistor (HBT). The same applies to other transistors explained below.

The bias circuit 110 (first bias circuit) is a main bias circuit that generates the bias current Ibias1 (first current) or the bias voltage (first voltage) and supplies the bias current Ibias1 or the bias voltage to the base of the transistor Q1. In accordance with the bias current Ibias1 supplied from the bias circuit 110, a power gain of the transistor Q1 is controlled. The current supplied from a terminal T3 to the bias circuit 110 may be a constant current or a control current for controlling the amount of the bias current Ibias1.

The bias circuit 120 (second bias circuit) generates the bias current Ibias2 (second current) or the bias voltage (second voltage) and supplies the bias current Ibias2 or the bias voltage to the base of the transistor Q1. The bias circuit 120 is an auxiliary bias circuit that supplies, as the bias current Ibias2, part of an AC component of the bias current, which is supplied as the bias current Ibias1, in accordance with an increase in the power level of the input signal RFin. A specific configuration example of the bias circuits 110 and 120 will be described later.

The capacitor element C1 (second capacitor element) is connected in series between the input terminal T1 and the base of the transistor Q1. The capacitor element C1 is a coupling capacitor that eliminates a DC component of the input signal RFin.

The resistor element R1 (first resistor element) is connected in series between the base of the transistor Q1 and output of the bias circuit 110. The resistor element R1 is a ballast resistor to suppress thermal positive feedback of the transistor Q1. That is, the transistor Q1 has thermal positive feedback characteristics in which as the temperature of a transistor element increases, the amount of a collector current increases, which causes a further increase in the temperature and an accompanying increase in the amount of the collector current. Therefore, for example, in a multi-finger configuration in which a plurality of unit transistors are connected in parallel, if each unit transistor does not include a ballast resistor, current flows intensively into part of the unit transistors, which may cause thermal runaway and bring destruction. In contrast, in the power amplifier circuit 100, with the provision of the resistor element R1, the current flowing to the resistor element R1 increases as the base current of the transistor Q1 increases, and an increase in the base voltage of the transistor Q1 is suppressed by a voltage drop in the resistor element R1. Accordingly, an increase in the base current of the transistor Q1 and an accompanying increase in the collector current are suppressed, and thermal runaway may be avoided.

Figure 2:
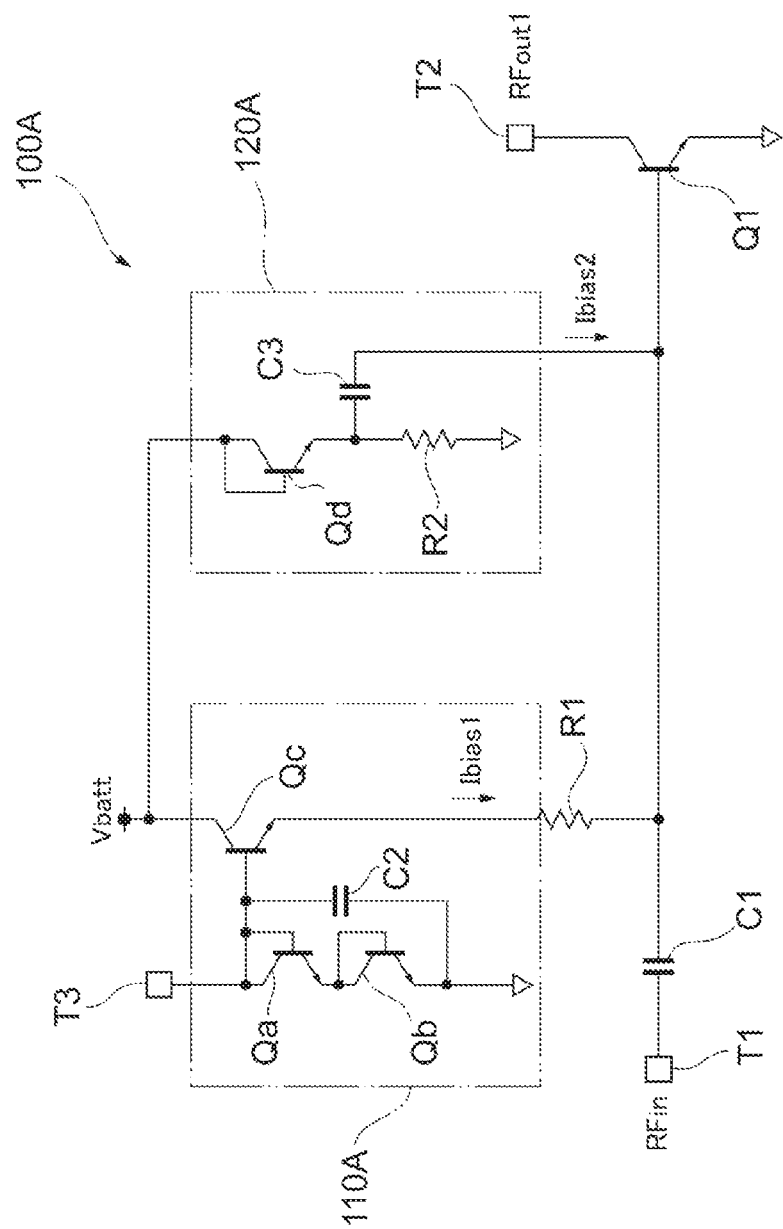
FIG. 2 is a diagram illustrating an example of a configuration of the power amplifier circuit according to the first embodiment of the present disclosure.

Next, configurations of the bias circuits 110 and 120 will be explained in detail with reference to FIG. 2. FIG. 2 is a diagram illustrating an example of a configuration of a power amplifier circuit according to the first embodiment of the present disclosure. Specifically, FIG. 2 illustrates a specific configuration example (bias circuits 110A and 120A) of the bias circuits 110 and 120 illustrated in FIG. 1.

The bias circuit 110A includes, for example, transistors Qa, Qb, and Qc and a capacitor element C2.

The transistors Qa and Qb are connected in series. Specifically, a constant current or control current is supplied from the terminal T3 to the collector of the transistor Qa, the collector of the transistor Qa is connected to the base of the transistor Qa (hereinafter, may also be referred to as "diode connection"), and the emitter of the transistor Qa is connected to the collector of the transistor Qb. Diode connection is performed on the transistor Qb, and the emitter of the transistor Qb is connected to the ground. Accordingly, a voltage at a specific level (for example, about 2.8 V) is generated at the collector of the transistor Qa. Instead of the transistors Qa and Qb, diode elements may be used.

A power supply voltage Vbatt is supplied to the collector of the transistor Qc, the base of the transistor Qc is connected to the collector of the transistor Qa, and the emitter of the transistor Qc is connected to one end of the resistor element R1. The transistor Qc supplies the bias current Ibias1 to the base of the transistor Q1 via the resistor element R1. One end of the capacitor element C2 is connected to the base of the transistor Qc, and the other end of the capacitor element C2 is connected to the ground. The capacitor element C2 grounds the base voltage of the transistor Qc in an AC manner.

With the above configuration, the bias circuit 110A supplies the main bias current Ibias1 to the base of the transistor Q1. The bias circuit 110A is an example of a configuration of the bias circuit 110 which may be applied to the power amplifier circuit 100 illustrated in FIG. 1, and the present disclosure is not limited to the above configuration.

The bias circuit 120A includes, for example, a transistor Qd, a resistor element R2, and a capacitor element C3.

Diode connection is performed on the transistor Qd, the power supply voltage Vbatt is supplied to the collector of the transistor Qd, and the emitter of the transistor Qd is connected to one end of the resistor element R2.

One end of the resistor element R2 (second resistor element) is connected to the emitter of the transistor Qd, and the other end of the resistor element R2 is connected to the ground. The resistor element R2 configures a specific example of an impedance circuit. By adjusting the resistance of the resistor element R2, the amount of a current flowing in the transistor Qd (that is, the amount of the bias current Ibias2) may be adjusted. Furthermore, by configuring the impedance circuit by the resistor element R2, all the components of the bias circuit 120A may be formed on a chip on which the transistor Q1 is formed. Therefore, the bias circuit 120A may be configured without necessarily increasing the number of terminal as compared with a configuration in which the bias circuit 120A is not provided.

One end of the capacitor element C3 (first capacitor element) is connected to a connection point of the emitter of the transistor Qd and the resistor element R2, and the other end of the capacitor element C3 is connected to the base of the transistor Q1. The capacitor element C3 blocks between the base of the transistor Q1 and the emitter of the transistor Qd in a DC manner and connects between the base of the transistor Q1 and the emitter of the transistor Qd in an AC manner. Accordingly, the capacitor element C3 blocks a DC current flowing in the transistor Qd, and at the same time, propagates the signal amplitude of the input signal RFin to the emitter of the transistor Qd.

With the above configuration, in the bias circuit 120A, in the case where the power level of the input signal RFin is relatively small, the signal amplitude of the input signal RFin propagated to the emitter of the transistor Qd via the capacitor element C3 is small. Therefore, the signal amplitude of the emitter voltage of the transistor Qd is small, and the bias current Ibias2 is not supplied. In contrast, in the case where the power level of the input signal RFin is relatively large, the signal amplitude of the input signal RFin propagated to the emitter of the transistor Qd via the capacitor element C3 is large. At this time, the impedance of a passage of the capacitor element C3 and the transistor Qd when viewed from the base of the transistor Q1 decreases, and current starts to be supplied. Therefore, part of an AC component of the bias current supplied as the bias current Ibias1 is supplied as the bias current Ibias2 to the base of the transistor Q1 via the transistor Qd and the capacitor element C3. Accordingly, at the time when a large signal is input, an increase in the bias current Ibias2 suppresses a voltage drop in the resistor element R1 and an accompanying drop in the base voltage of the transistor Q1. Therefore, with a power amplifier circuit 100A, a gain compression at the time when a large signal is input may be reduced, and the size of output power at which a power gain starts to decrease (hereinafter, may also be referred to as a "saturation power") may be increased.

With the configuration disclosed in Japanese Unexamined Patent Application Publication No. 2005-6212 (hereinafter, may also be referred to as a "known configuration"), as described above, when signal amplitude is transmitted to the emitter of a bipolar transistor included in an impedance circuit, the signal amplitude may be propagated from the emitter to the base of the bipolar transistor via a parasitic capacitance between the base and emitter of the bipolar transistor. Furthermore, a control voltage is supplied to the base of the bipolar transistor via a resistor element. Therefore, the bipolar transistor has a problem that the base voltage vibrates in accordance with vibrations of the emitter voltage, which causes insufficient current flow between the collector and emitter, and a function as a bias circuit cannot be fully achieved. In order to solve the above problem, for example, a method for reducing vibrations of the base voltage by connecting a capacitor element (decoupling capacitor) between the base of the bipolar transistor included in the impedance circuit and the ground may be considered. However, decoupling capacitors generally require a relatively large circuit area, and therefore, there is a problem that the above method causes an increase in the chip area.

In contrast, in the power amplifier circuit 100A, a power supply voltage Vbatt is directly supplied to the base of the transistor Qd. Accordingly, vibrations of the base voltage caused by the parasitic capacitance between the base and emitter of the transistor Qd may be reduced, without necessarily adding a decoupling capacitor, which has a relatively large capacitance. Therefore, compared with the known configuration, an increase in the chip area may be suppressed, and at the same time, insufficiency of the bias current at the time when a large signal is input may be suppressed.

In the bias circuit 120A, instead of the transistor Qd, a diode element may be used. In the case where a diode element is used, the collector of the transistor Qd may be replaced with the anode of the diode element, and the emitter of the transistor Qd may be replaced with the cathode of the diode element.

Figure 3:
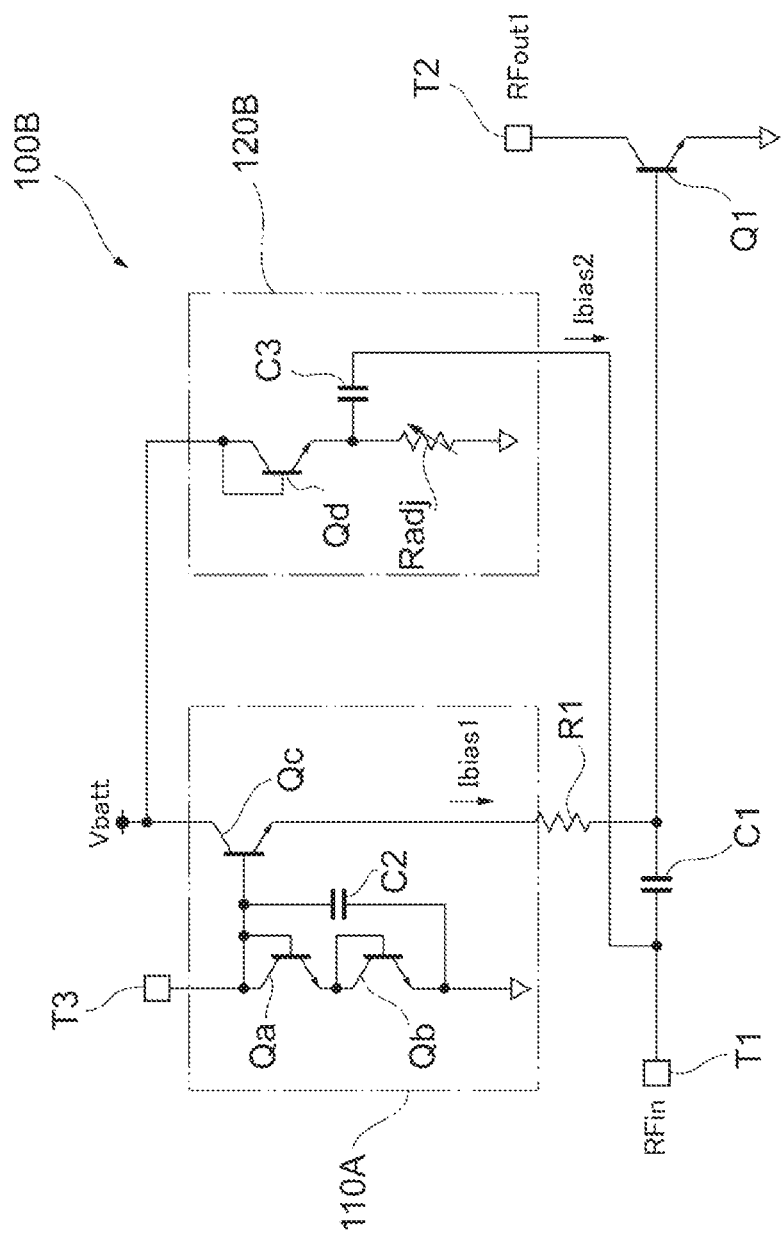
FIG. 3 is a diagram illustrating an example of a configuration of a power amplifier circuit according to a second embodiment of the present disclosure.

FIG. 3 is a diagram illustrating an example of a configuration of a power amplifier circuit according to a second embodiment of the present disclosure. The same elements as those in the power amplifier circuit 100A will be referred to with the same reference signs and explanation for those elements will be omitted. Furthermore, in the second embodiment, description of matters that are common to the first embodiment will be omitted, and only differences will be explained. In particular, similar effects obtained with similar configurations will not be mentioned in every embodiment.

As illustrated in FIG. 3, a power amplifier circuit 100B includes a bias circuit 120B, instead of the bias circuit 120A illustrated in FIG. 2. Specifically, the bias circuit 120B includes a variable resistor Radj, instead of the resistor element R2 in the bias circuit 120A. The variable resistor Radj configures a specific example of an impedance circuit. Effects obtained by applying the variable resistor Radj to the bias circuit 120B will be explained below.

The power amplifier circuit 100B supports RF signals of a plurality of different communication standards (for example, 2G, 3G, 4G, etc.) and a plurality of different frequency bands (for example, a high band, a middle band, a low band, etc.). In this case, the size of a saturation power and the size of a gain reduced may vary according to at least one of the communication standard and the frequency band of the input signal RFin. In contrast, in the bias circuit 120B, the resistance of the variable resistor Radj may be changed according to at least one of the communication standard, the frequency band, and the like of the input signal RFin. Accordingly, the amount of a current flowing in the transistor Qd and the emitter voltage of the transistor Qd are adjusted, and therefore, the amount of the bias current Ibias2 supplied to the base of the transistor Q1 via the transistor Qd and the capacitor element C3 is adjusted. Consequently, with the power amplifier circuit 100B, the degree of suppression of a decrease in the base voltage of the transistor Q1 may be adjusted according to at least one of the frequency band and the communication standard of the input signal RFin, and an appropriate saturation power may be achieved.

In the power amplifier circuit 100B, the bias circuit 110A and the bias circuit 120B operate separately. Therefore, only the amount of the bias current Ibias2 is adjusted, without necessarily the amount of the main bias current 'bias' being adjusted. Therefore, the degree of suppression of a decrease in the base voltage may be adjusted, without necessarily depending on control of the size of a power gain in the transistor Q1.

The variable resistor Radj may be configured such that, for example, the resistance varies according to the characteristics and variations in values of components such as a transistor, a capacitor element, and a resistor element included in the power amplifier circuit 100B.

In FIG. 3, a configuration is illustrated in which the impedance of the bias circuit 120A illustrated in FIG. 2 may be adjusted by varying the resistance of the resistor element R2 in the bias circuit 120A. However, a configuration in which the impedance of the bias circuit 120 may be adjusted is not limited to the configuration illustrated in FIG. 3. For example, instead of the resistance of the resistor element R2, the capacitance of the capacitor element C3 may be variable.

Furthermore, the position at which the other end of the capacitor element C3 is connected is not particularly limited as long as the other end of the capacitor element C3 is connected to a position between the input terminal T1 and the base of the transistor Q1. For example, as illustrated in FIG. 3, the other end of the capacitor element C3 may be connected between the input terminal T1 and the capacitor element C1.

Figure 4:
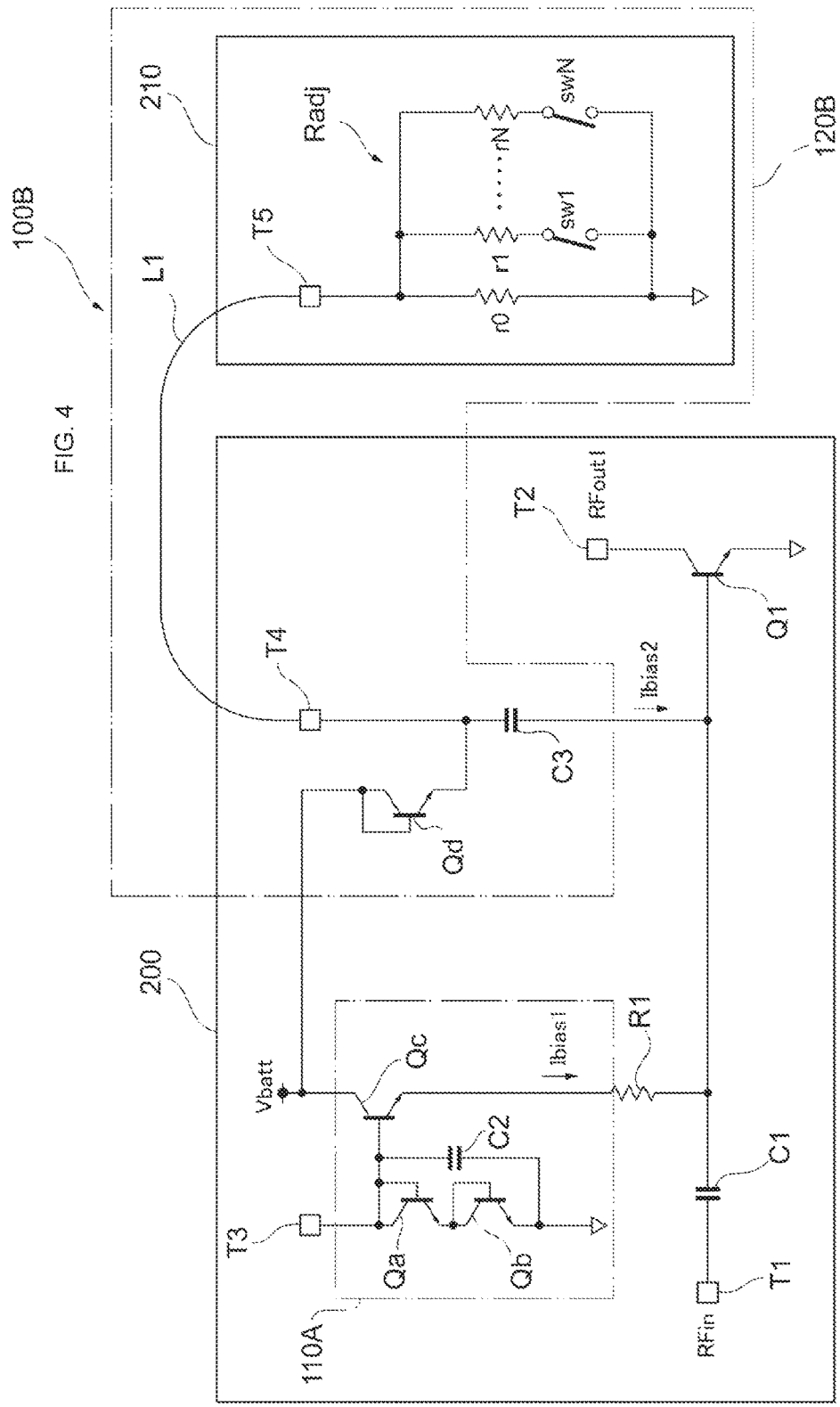
FIG. 4 is a diagram illustrating an example of a configuration of a variable resistor.

FIG. 4 is a diagram illustrating an example of a configuration of the variable resistor Radj. As illustrated in FIG. 4, in the power amplifier circuit 100B, for example, components other than the variable resistor Radj (that is, the transistor Q1, the bias circuit 110A, the resistor element R1, the capacitor element C1, the transistor Qd, and the capacitor element C3) are formed on an HBT chip 200, and the variable resistor Radj is formed outside the HBT chip 200. Specifically, for example, the variable resistor Radj is formed in a control integrated circuit (IC) 210 that generates a control signal for controlling the resistance of the variable resistor Radj in accordance with at least one of the communication standard and the frequency band of the input signal RFin. A terminal T4 formed at the HBT chip 200 is connected to a terminal T5 formed at the control IC 210 by wire bonding via a wire L1.

The variable resistor Radj includes, for example, N+1 (N is an integer of 1 or more) resistor elements r0 to rN and N switches sw1 to swN.

The resistor elements r0 to rN are connected in parallel. One ends of the resistor elements r0 to rN are connected to the terminal T5, and the other ends of the resistor elements r0 to rN are connected to the ground or connected to the ground with the switches sw1 to swN interposed therebetween. Turning on and off of the switches sw1 to swN is controlled in accordance with a control signal generated by the control IC 210. Accordingly, a combination of the resistor elements r0 to rN that are electrically connected is changed, and the resultant resistance of the variable resistor Radj is controlled.

Furthermore, by connecting the terminal T4 to the terminal T5 via the wire L1, an inductance component is generated between the base of the transistor Q1 and the variable resistor Radj. Accordingly, leakage of the high-frequency input signal RFin toward the bias circuit 120B may be suppressed. The bias circuit 120B may include a variable inductor instead of the wire L1 and may have a configuration in which the impedance is adjusted by adjustment of the inductance value of the variable inductor.

The variable resistor Radj is not necessarily configured as described above. For example, in the case where the control IC 210 includes a complementary metal-oxide-semiconductor (CMOS), a field-effect transistor (metal-oxide-semiconductor field-effect transistor (MOSFET)) may be used as a variable resistor. In this case, the resistance may be changed by controlling the gate voltage of the MOSFET by using the ON resistance of the MOSFET.

Furthermore, a chip on which the variable resistor Radj is formed is not limited to a control IC. For example, the variable resistor Radj may be directly formed on a substrate (for example, a printed circuit board (PCB)) on which an HBT chip, a control IC, or the like is mounted.

Figure 5:
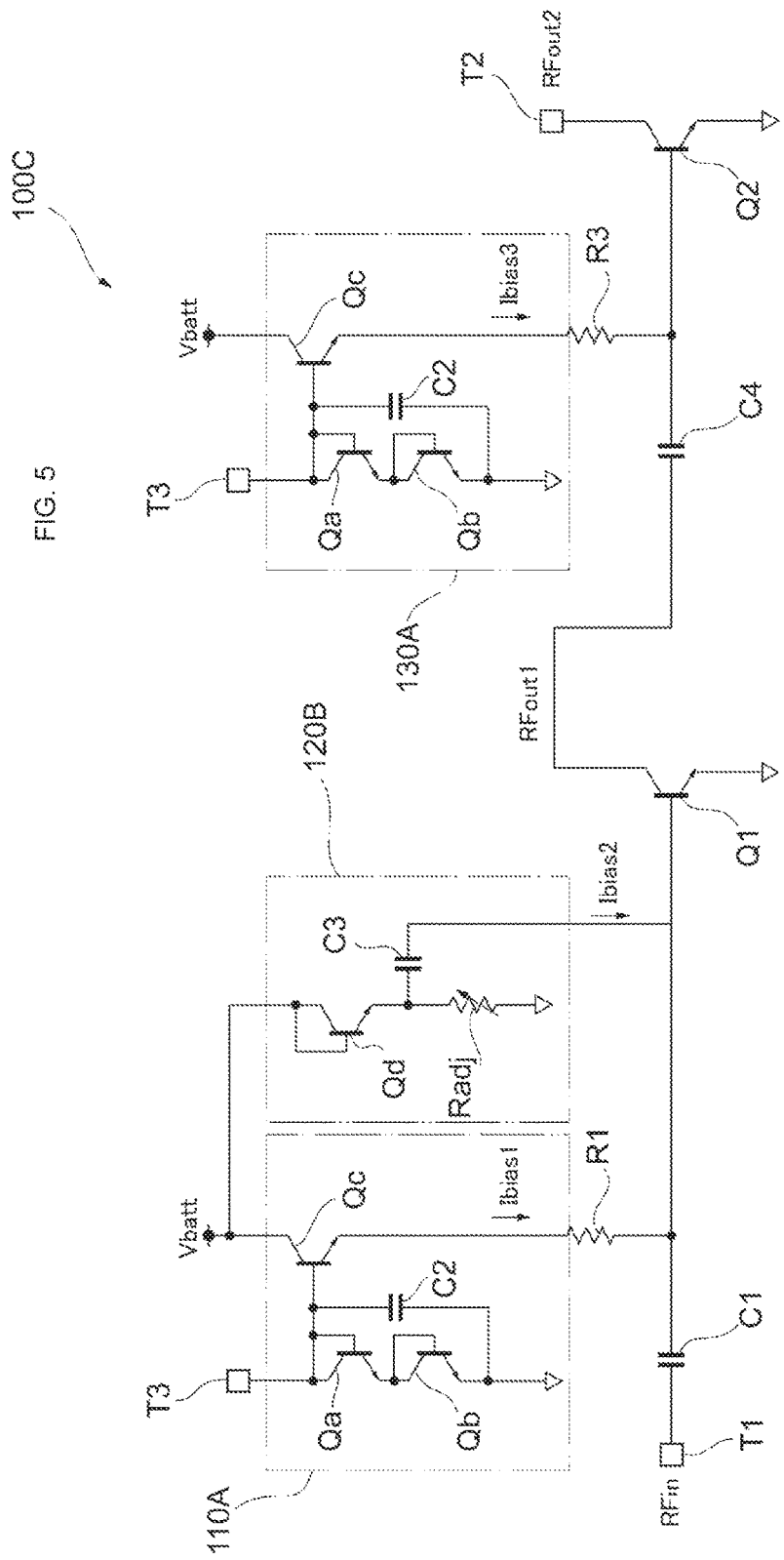
FIG. 5 is a diagram illustrating an example of a configuration of a power amplifier circuit according to a third embodiment of the present disclosure.

FIG. 5 is a diagram illustrating an example of a configuration of a power amplifier circuit according to a third embodiment of the present disclosure. As illustrated in FIG. 5, a power amplifier circuit 100C has a configuration in which amplifier transistors that amplify power of the input signal RFin are connected in two stages.

A circuit in a preceding stage (drive stage) has a configuration similar to that of the power amplifier circuit 100B illustrated in FIG. 3, and therefore, a detailed explanation for the circuit in the preceding stage will be omitted. A circuit in a subsequent stage (power stage) includes a transistor Q2, a bias circuit 130A, a capacitor element C4, and a resistor element R3.

A power supply voltage (not illustrated in FIG. 5) is supplied to the collector of the transistor Q2 (second amplifier transistor), the capacitor element C4 is connected in series with the base of the transistor Q2, and the emitter of the transistor Q2 is connected to the ground. The amplification signal RFout1 (first amplification signal) is supplied to the base of the transistor Q2 via the capacitor element C4, and a bias current Ibias3 (third current) or a bias voltage (third voltage) is supplied from the bias circuit 130A to the base of the transistor Q2 via the resistor element R3. Accordingly, an amplification signal RFout2 (second amplification signal) obtained by amplifying the amplification signal RFout1 is output from the collector of the transistor Q2.

The bias circuit 130A (third bias circuit), the capacitor element C4, and the resistor element R3 (third resistor element) are similar to the bias circuit 110A, the capacitor element C1, and the resistor element R1, respectively, illustrated in FIG. 2, and therefore, a detailed explanation for the bias circuit 130A, the capacitor element C4, and the resistor element R3 will be omitted.

As described above, also with the configuration in which amplifier transistors are connected in two stages, by the power amplifier circuit 100C including the bias circuit 120B in the preceding stage, a decrease in the base voltage of the transistor Q1 in the preceding stage may be suppressed, and a gain compression may thus be reduced. Furthermore, as illustrated in FIG. 5, with the use of the bias circuit 120B in the preceding stage, for example, a power gain in the preceding stage may be intentionally increased (that is, a gain expansion is generated) so that a gain compression generated in the subsequent stage can be canceled out. With the multi-stage configuration in which a plurality of amplifier transistors is connected, in general, the amount of a gain compression in the final stage is largest. In order to reduce the gain compression in the final stage, a large circuit area is required. In contrast, with the power amplifier circuit 100C, a gain expansion may be intentionally generated in a non-final stage, and the gain compression in the final stage may thus be canceled out. Therefore, an increase in the circuit area may be suppressed, and at the same time, a saturation power may be increased.

The number of stages of amplifier transistors that are connected in multiple stages is not limited to two. The amplifier transistors may be connected in three or more stages.

Furthermore, the above configuration is not intended to limit the stage in which the bias circuit 120 (120A and 120B) is provided in a multi-stage configuration to the first stage. For example, the bias circuit 120 may be provided in a second stage or later stages or the bias circuit 120 may be provided in all the stages.

Exemplary embodiments of the present disclosure have been described above. The power amplifier circuit 100 (100A to 100C) includes the transistor Q1 that amplifies the input signal RFin, the bias circuit 110 (110A), the bias circuit 120 (120A and 120B), and the resistor element R1 connected in series between the base of the transistor Q1 and the bias circuit 110. Furthermore, the bias circuit 120 (120A and 120B) includes a diode whose anode is supplied the power supply voltage Vbatt, an impedance circuit provided between the cathode of the diode and the ground, and the capacitor element C3 whose one end is connected to a connection point of the diode and the impedance circuit and other end supplies the bias current Ibias2 to the base of the transistor Q1. Accordingly, at the time when a large signal is input, part of the bias current is supplied as the bias current Ibias2 via the transistor Qd and the capacitor element C3, and therefore, a voltage drop in the resistor element R1 and an accompanying drop in the base voltage of the transistor Q1 may be suppressed. Consequently, with the power amplifier circuit 100, a gain compression at the time when a large signal is input may be reduced, and a saturation power may be increased.

Furthermore, although a diode included in the bias circuit 120 (120A and 120B) is not particularly limited, for example, the diode may be the transistor Qd.

Furthermore, in the power amplifier circuit 100B, the other end of the capacitor element C3 included in the bias circuit 120B may be connected between the input terminal T1 and the capacitor element C1.

Furthermore, in the power amplifier circuit 100A, an impedance circuit included in the bias circuit 120A includes the resistor element R2. Accordingly, in the power amplifier circuit 100A, the amount of the bias current Ibias2 may be adjusted by adjusting the resistance of the resistor element R2. Furthermore, all the components included in the bias circuit 120A may be formed on a chip on which the transistor Q1 is formed. Therefore, the bias circuit 120A may be configured without necessarily increasing the number of terminals as compared with a configuration in which the bias circuit 120A is not provided.

Furthermore, in the power amplifier circuits 100B and 100C, an impedance circuit included in the bias circuit 120B includes the variable resistor Radj. Accordingly, in the power amplifier circuits 100B and 100C, the resistance of the variable resistor Radj may be changed according to at least one of the communication standard and the frequency band of the input signal RFin. Therefore, the amount of the bias current Ibias2 may be adjusted in accordance with at least one of the frequency band and the communication standard of the input signal RFin, and an appropriate saturation power may be achieved.

A method for forming the power amplifier circuits 100B and 100C is not particularly limited. For example, the transistor Q1, the bias circuit 110A, the resistor element R1, the capacitor element C1, the transistor Qd, and the capacitor element C3 may be formed on the HBT chip 200, and the variable resistor Radj may be formed outside the HBT chip 200. The variable resistor Radj may be formed on the control IC 210.

The power amplifier circuit 100C includes the transistor Q2 that amplifies the amplification signal RFout1, the bias circuit 130A, and the resistor element R3 connected in series between the base of the transistor Q2 and the bias circuit 130A. The bias circuit 120B is applied to the transistor Q1 in the preceding stage. Accordingly, a gain expansion may be intentionally generated in the preceding stage so that the gain compression generated in the subsequent stage can be canceled out. Therefore, an increase in the circuit area may be suppressed, and at the same time, a saturation power may be increased.

The foregoing embodiments are provided to facilitate understanding of the present disclosure and are not intended to limit the scope of the present disclosure. Changes or improvements may be made to the present disclosure without departing from the scope of the present disclosure, and the present disclosure also includes equivalents thereof. That is, design changes may be made to the embodiments in an appropriate manner by those skilled in the art, and such embodiments are also within the scope of the present disclosure as long as they have features of the present disclosure. The individual elements included in the embodiments and the arrangements, materials, conditions, shapes, sizes, and the like thereof are not limited to those described above as examples, and they may be changed in an appropriate manner. In addition, the elements included in the embodiments can be combined with each other as long as it is technically possible, and such combination is also within the scope of the present disclosure as long as the combination has features of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
    a first amplifier transistor, wherein an input signal is supplied to a base of the first amplifier transistor, and a first amplification signal is obtained by amplifying the input signal and is output from a collector of the first amplifier transistor;
    a first bias circuit configured to supply a first current or a first voltage to the base of the first amplifier transistor;
    a second bias circuit configured to supply a second current or a second voltage to the base of the first amplifier transistor; and
    a first resistor connected in series between the base of the first amplifier transistor and the first bias circuit,
    wherein the second bias circuit comprises:
        a diode element, wherein a power supply voltage is supplied to an anode of the diode,
        an impedance circuit connected between a cathode of the diode element and ground, and
        a first capacitor, wherein a first end of the first capacitor is connected to a node between the cathode of the diode element and the impedance circuit, and the second current or the second voltage is supplied from a second end of the first capacitor to the base of the first amplifier transistor.

2. The power amplifier circuit according to claim 1,
wherein the diode element comprises a transistor, and
wherein the power supply voltage is supplied to a collector of the transistor, a base of the transistor is connected to the collector of the transistor, and an emitter of the transistor is connected to the impedance circuit.

3. The power amplifier circuit according to claim 1, further comprising:
    a second capacitor connected in series between an input terminal of the power amplification circuit and the base of the first amplifier transistor,
    wherein the second end of the first capacitor is connected between the input terminal and the second capacitor.

4. The power amplifier circuit according to claim 2, further comprising:
a second capacitor connected in series between an input terminal of the power amplification circuit and the base of the first amplifier transistor,
wherein the second end of the first capacitor is connected between the input terminal and the second capacitor.

5. The power amplifier circuit according to claim 1,
wherein the impedance circuit comprises a second resistor, wherein a first end of the second resistor is connected to the cathode of the diode and a second end of the second resistor is connected to ground.

6. The power amplifier circuit according to claim 2,
wherein the impedance circuit comprises a second resistor, wherein a first end of the second resistor is connected to the cathode of the diode and a second end of the second resistor is connected to ground.

7. The power amplifier circuit according to claim 3,
wherein the impedance circuit comprises a second resistor, wherein a first end of the second resistor is connected to the cathode of the diode and a second end of the second resistor is connected to ground.

8. The power amplifier circuit according to claim 1,
wherein the impedance circuit comprises a variable resistor, a resistance of the variable resistor being adjusted according to at least one of a communication standard of the input signal and a frequency band of the input signal.

9. The power amplifier circuit according to claim 2,
wherein the impedance circuit comprises a variable resistor, a resistance of the variable resistor being adjusted according to at least one of a communication standard of the input signal and a frequency band of the input signal.

10. The power amplifier circuit according to claim 3,
wherein the impedance circuit comprises a variable resistor, a resistance of the variable resistor being adjusted according to at least one of a communication standard of the input signal and a frequency band of the input signal.

11. The power amplifier circuit according to claim 8,
wherein the first amplifier transistor, the first bias circuit, the first resistor, the diode element, and the first capacitor are formed on a heterojunction bipolar transistor chip, and
wherein the variable resistor is formed on a chip other than the heterojunction bipolar transistor chip.

12. The power amplifier circuit according to claim 8,
wherein the variable resistor is formed on a control integrated circuit configured to output a signal, and
wherein the resistance of the variable resistor is configured to be adjusted based on the signal.

13. The power amplifier circuit according to claim 8,
wherein the variable resistor comprises a plurality of resistors connected in parallel with each other, and
wherein all but one of the plurality of resistors is selectively connected to ground.

14. The power amplifier circuit according to claim 13,
wherein the second end of the first capacitor is connected directly to the base of the first amplifier transistor.

15. The power amplifier circuit according to claim 1, further comprising:
a second amplifier transistor, wherein the first amplification signal is supplied to a base of the second amplifier transistor, and a second amplification signal is obtained by amplifying the first amplification signal and is output from a collector of the second amplifier transistor;
a third bias circuit configured to supply a third current or a third voltage to the base of the second amplifier transistor; and
a third resistor connected in series between the base of the second amplifier transistor and the third bias circuit.

16. The power amplifier circuit according to claim 2, further comprising:
a second amplifier transistor, wherein the first amplification signal is supplied to a base of the second amplifier transistor, and a second amplification signal is obtained by amplifying the first amplification signal and is output from a collector of the second amplifier transistor;
a third bias circuit configured to supply a third current or a third voltage to the base of the second amplifier transistor; and
a third resistor connected in series between the base of the second amplifier transistor and the third bias circuit.

17. The power amplifier circuit according to claim 3, further comprising:
a second amplifier transistor, wherein the first amplification signal is supplied to a base of the second amplifier transistor, and a second amplification signal is obtained by amplifying the first amplification signal and is output from a collector of the second amplifier transistor;
a third bias circuit configured to supply a third current or a third voltage to the base of the second amplifier transistor; and
a third resistor connected in series between the base of the second amplifier transistor and the third bias circuit.

18. The power amplifier circuit according to claim 5, further comprising:
a second amplifier transistor, wherein the first amplification signal is supplied to a base of the second amplifier transistor, and a second amplification signal is obtained by amplifying the first amplification signal and is output from a collector of the second amplifier transistor;
a third bias circuit configured to supply a third current or a third voltage to the base of the second amplifier transistor; and
a third resistor connected in series between the base of the second amplifier transistor and the third bias circuit.

* * * * *